(12) United States Patent
Shako et al.

(10) Patent No.: US 7,961,046 B2
(45) Date of Patent: Jun. 14, 2011

(54) DISTORTION COMPENSATING AMPLIFIER AND FRONT-END DISTORTION COMPENSATION AMPLIFYING DEVICE

(75) Inventors: Hideharu Shako, Kawasaki (JP);
Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 44 days.

(21) Appl. No.: 12/415,138

(22) Filed: Mar. 31, 2009

(65) Prior Publication Data

US 2009/0322425 A1    Dec. 31, 2009

(30) Foreign Application Priority Data

Jun. 30, 2008  (JP) .................. 2008-171417

(51) Int. Cl.
*H03F 1/26* (2006.01)
(52) U.S. Cl. ...................................... 330/149
(58) Field of Classification Search .................. 330/149; 455/114.3; 375/296
See application file for complete search history.

(56) References Cited

U.S. PATENT DOCUMENTS 5,404,378 A * 4/1995 Kimura .................. 375/296

FOREIGN PATENT DOCUMENTS

| JP | 05129845 | 5/1993 |
|----|----------|--------|
| JP | 2002176321 | 6/2002 |
| JP | 2005005834 | 1/2005 |
| WO | WO0108320 | 2/2001 |

* cited by examiner

*Primary Examiner* — Robert Pascal
*Assistant Examiner* — Khiem D Nguyen
(74) *Attorney, Agent, or Firm* — Fujitsu Patent Center

(57) ABSTRACT

A distortion compensating amplifier including a forward circuit and a feedback circuit and performing distortion compensation of a signal in the forward circuit by use of a gain of the feedback circuit, includes a detecting unit which detects that the gain of the forward circuit is changed, a calculating unit which calculates, when the detecting unit detects that the gain of the forward circuit is changed, the gain of the feedback circuit on the basis of an input signal to the forward circuit and an output signal from the forward circuit, and a feedback gain updating unit which updates the present gain of the feedback circuit with the gain calculated by the calculating unit.

6 Claims, 12 Drawing Sheets

DISTORTION COMPENSATING AMPLIFIER AND FRONT-END DISTORTION COMPENSATION AMPLIFYING DEVICE

CROSS-REFERENCE TO RELATED APPLICATIONS

This application is based upon and claims the benefit of priority of the prior Japanese Patent Application No. 2008-171417, filed on Jun. 30, 2008, the entire contents of which are incorporated herein by reference.

FIELD

The present invention relates to a distortion compensating amplifier including a forward circuit and a feedback circuit and to a front-end distortion compensation amplifying device.

BACKGROUND

On the occasion of employing a digital modulation system etc in wireless communications, an important technology is a technology of restraining a non-linear distortion by linearizing an increase characteristic of a power amplifier. The power amplifier, which restrains the non-linear distortion, is exemplified by a distortion compensating amplifier using a distortion compensation coefficient.

FIG. 1 is a diagram representing an example of a configuration of a conventional distortion compensating amplifier (Amplifier).

The distortion compensating amplifier includes a multiplier which multiplies a baseband signal X(I, Q) by a LUT (Look Up Table) parameter h(|X|), a digital-to-analog converter (DAC: Digital-Analog Converter), a quadrature converter (QMOD: Quadrature Modulator), a gain amplifier, a directional coupler (DC), an antenna, a down-converter (MIX: Mixer), an analog-to-digital converter (ADC: Analog-Digital Converter), a demodulator (DEM: Demodulator), a subtractor, an amplitude calculating unit (|X|), and a LUT unit.

When the baseband signal X(I, Q) is inputted to the distortion compensating amplifier, X(I, Q) is multiplied by the LUT parameter h(|X|) which undergoes addressing with an amplitude (|X|) of the baseband signal. A multiplied result is converted by the DAC into analog data. The QMOD quadrature-modulates the analog data which has thus been analog-converted. The quadrature-modulated data is, after a gain has been acquired by the amplifier, transmitted as an RF (Radio Frequency) output Y from the antenna.

Further, the directional coupler monitors the transmission output Y. The ADC in the frequency converter (MIX, down-converter), after down-converting the output Y into a sampling-enabled frequency, converts the output Y into the digital signal. The thus-converted digital signal is demodulated as baseband data Y(I, Q) by the DEM. The distortion compensating control is done so that the output signal of the amplifier becomes linear (linear type) with respect to the input signal by updating the distortion compensation coefficient in the LUT so as to make the demodulation data Y (I, Q) coincident with the baseband signal X(I, Q) on the reference side.

FIG. 3 is a diagram representing a principle of the distortion compensation.

An error component is obtained by comparing an input |X| with an output |Y|, and the distortion compensation parameter h(|X|) in the LUT is updated so that the error component gets approximate to "0". Herein, for simplicity, only correction of the amplitude will be explained. As a matter of fact, a phase rotation is also corrected.

FIG. 3 represents a characteristic curve (with no compensation of the distortion) of the output |Y| with respect to the input |X|. In an idealistic amplifier, the output is proportional to the input. Generally in the amplifier, however, the gain reduces when getting close to a saturation point, and hence the output Y decreases. The distortion compensation is defined as an operation of making the correction so that the output becomes linear (linear type) by multiplying the gain for the decrease in the output by the input |X| beforehand.

A general expression is given by the formula (1).

$$Y = X \cdot h(|X|) \cdot G \qquad \text{Formula (1)}$$

Herein, G is the gain of the amplifier. Further, h(|X|) is the LUT parameter read from the LUT. The correction is made so that the output becomes linear (linear type) with the LUT parameter h(|X|).

The linearity characteristic of the output Y can be improved by updating the LUT parameter (distortion compensation coefficient) h(|X|) so that the error component between the input |X| and the output |Y| becomes "0".

FIG. 4 is a diagram illustrating a configuration of the LUT unit. A new distortion compensation coefficient h'(|X|) in such a direction as to compress the error component is calculated from an error component e(I, Q) obtained from the input |X| and the output |Y| and from the distortion compensation coefficient h(|X|) used last time and is written to the address |X| in the LUT memory of the LUT. A coefficient updating method of updating the distortion compensation coefficient h(|X|) by the coefficient updating unit is described in the Patent document 4.

If the distortion compensation coefficient is converged, the formula (2) is established.

$$X = X \cdot h(|X|) \cdot G \cdot Gfb \qquad \text{Formula (2)}$$

Hence, h(|X|) is expressed in the following formula (3).

$$h(|X|) = \frac{1}{G \cdot Gfb} \qquad \text{Formula (3)}$$

Herein, Gfb is a feedback gain (FB gain: Feedback Gain).

FIG. 2 is a diagram representing an example of the distortion compensating amplifier having a gain adjusting function unit. Components other than the gain adjusting function unit are substantially the same as those in the example of the distortion compensating amplifier in FIG. 1.

The transmission output can be adjusted with a scheme that the FB gain changes in a way that provides an FB gain adjusting function.

When adjusting a gain adjustment volume, a braking voltage of VATT (Variable Attenuator) fluctuates. When a quantity of attenuation of the VATT fluctuates with the result that the FB gain changes. When the FB gain changes, the distortion compensation coefficient is updated, and an output level changes.

In the case of the configuration in FIG. 2, the distortion compensation coefficient is used for changing the output level. The FB gain is multiplied by k for adjusting the output level.

At this time, when the new distortion compensation coefficient is converged, the following formula (4) is established.

$$X = X \cdot h'(|X|) \cdot G \cdot Gfb \cdot k \qquad \text{Formula (4)}$$

Therefore, h'(|X|) is given in the following formula (5).

$$h'(|X|) = \frac{1}{G \cdot Gfb \cdot k} \quad \text{Formula (5)}$$

From the formulae (3) and (5), a relationship between the original distortion compensation coefficient h(|X|) and the new distortion compensation coefficient h'(|X|) becomes as represented in the following formula (6).

$$h'(|X|) = \frac{h(|X|)}{k} \quad \text{Formula (6)}$$

Accordingly, when the FB gain is multiplied by k, the distortion compensation coefficient (LUT coefficient) turns out to be 1/k-fold. As a result, an output Y' after multiplying the FB gain by k becomes as given in the following formula (7).

$$Y' = X \cdot h(|X|) \cdot (1/k) \cdot G = Y \cdot (1/k) \quad \text{Formula (7)}$$

As a result of multiplying the FB gain by k, the output Y' becomes 1/k-fold of the original output Y.

FIGS. 5 and 6 are diagrams each representing an example of a range of the distortion compensation coefficient.

With respect to the distortion compensation coefficient, the real part thereof is set in a range of 0 through 2, and the imaginary part thereof is set in a range of −1 through +1. If a value of the distortion compensation coefficient rises due to the adjustment of the FB gain, the range usable for the linearity correction of the distortion compensation reduces.

For example, as in FIG. 5, the distortion compensation coefficient adjusted to "1" when shipped from the factory is, if adjusted to a through the adjustment of the FB gain, capable of only 2/α-fold compensation though capable of 2-fold compensation when shipped from the factory.

Further, according to the method of changing the output level by adjusting the FB gain, there is no change in the output level immediately after adjusting the FB gain, and the output level does not change till the distortion compensation coefficient (LUT coefficient) is updated with the change in the FB gain. Accordingly, a time lag occurs till the output level changes since the FB gain has been adjusted. Actually, there might be a case in which the time lag on the order of 1 sec occurs.

[Patent document 1] Japanese Patent Laid-Open Publication No. H05-129845
[Patent document 2] Japanese Patent Laid-Open Publication No. 2005-5834
[Patent document 3] Japanese Patent Laid-Open Publication No. 2002-176321
[Patent document 4] International Publication WO 01/008320

SUMMARY

A first mode is a distortion compensating amplifier including a forward circuit and a feedback circuit and performing distortion compensation of a signal in the forward circuit by use of a gain of the feedback circuit, comprising: a detecting unit detecting that the gain of the forward circuit is changed; a calculating unit calculating, when the detecting unit detects that the gain of the forward circuit is changed, the gain of the feedback circuit on the basis of an input signal to the forward circuit and an output signal from the forward circuit; and a feedback gain updating unit updating the present gain of the feedback circuit with the gain calculated by the calculating unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Embodiments will hereinafter be described with reference to the drawings. Configurations in the following embodiments are exemplifications, and the present invention is not limited to the configurations in the embodiments that will hereinafter be disclosed.

First Embodiment

Example of Configuration

Figure 1:
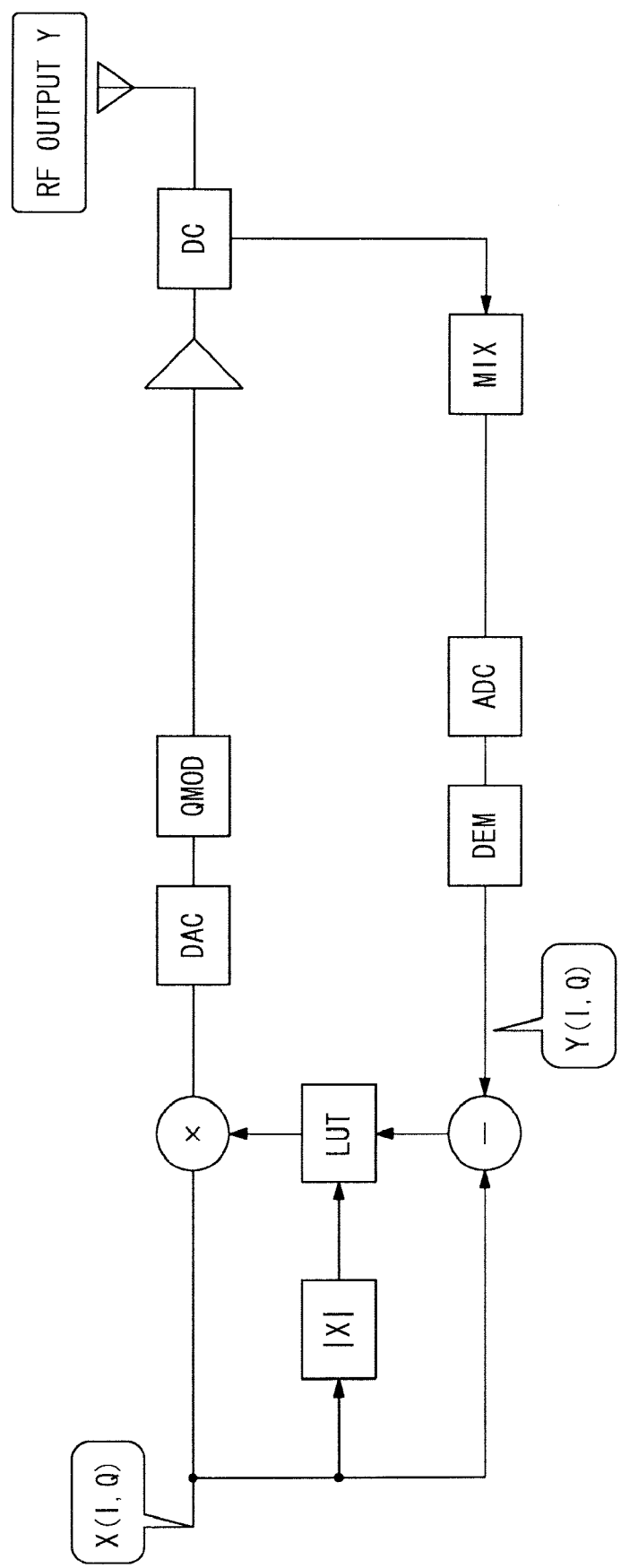
FIG. 1 is a diagram representing an example of a configuration of a distortion compensating amplifier.
Figure 2:
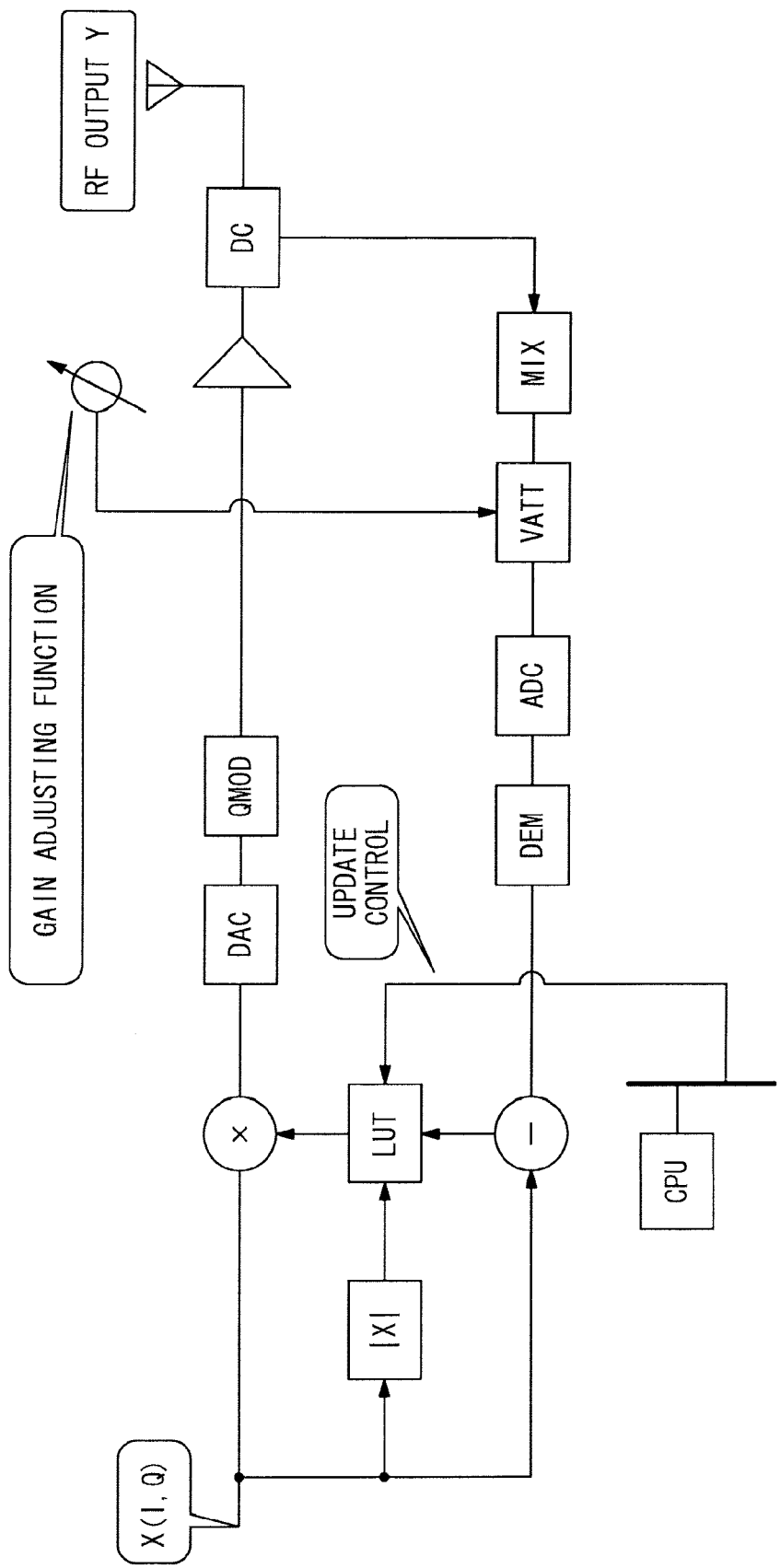
FIG. 2 is a diagram representing an example of a configuration of a gain adjusting function of the distortion compensating amplifier.
Figure 3:
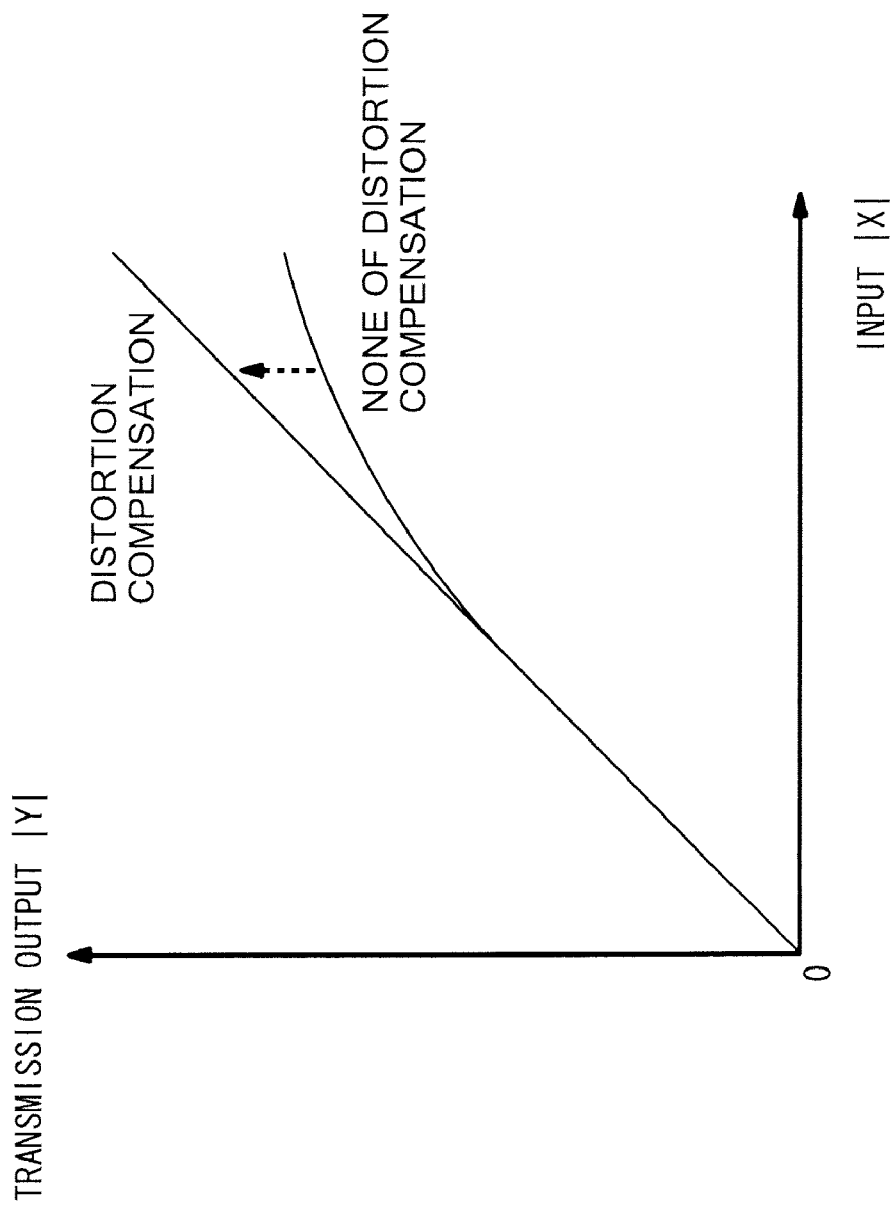
FIG. 3 is a graphic chart representing a relationship of an output to an input.
Figure 4:
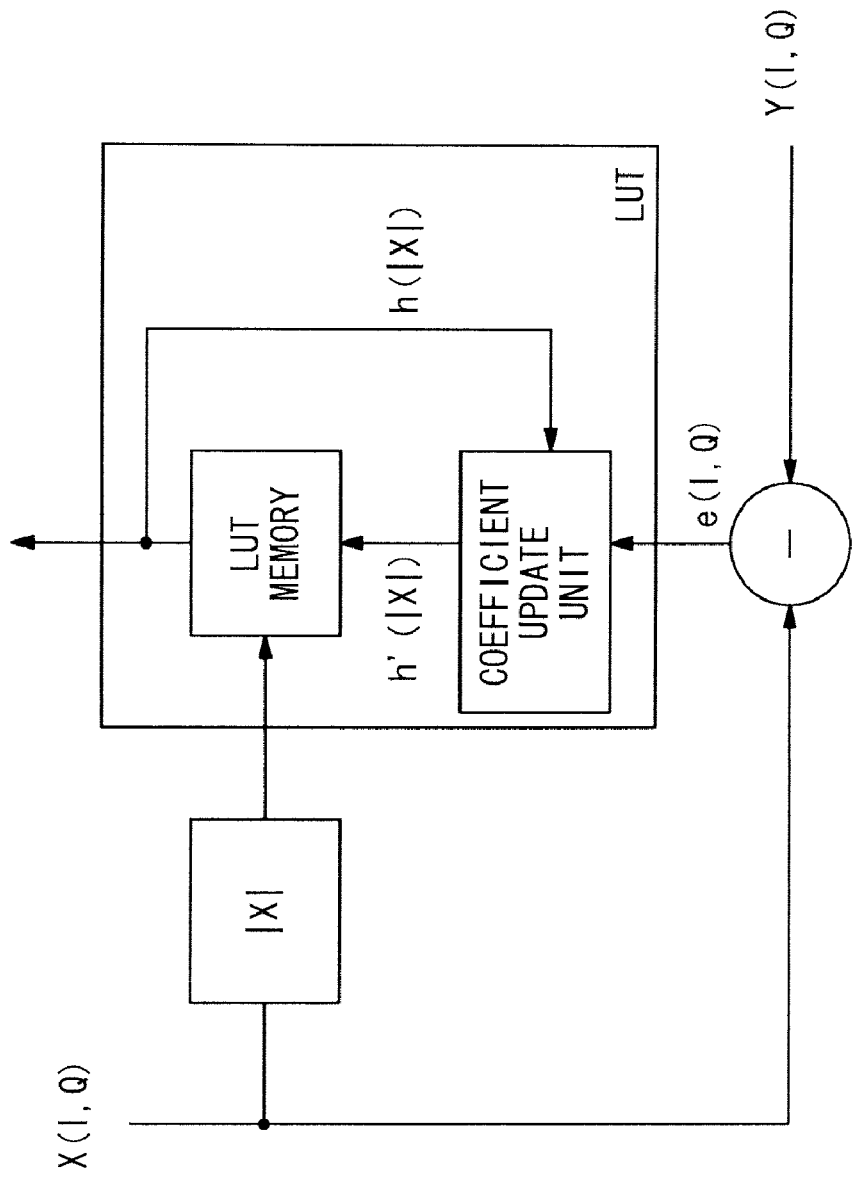
FIG. 4 is a diagram representing an example of a configuration of a LUT unit of the distortion compensating amplifier.
Figure 5:
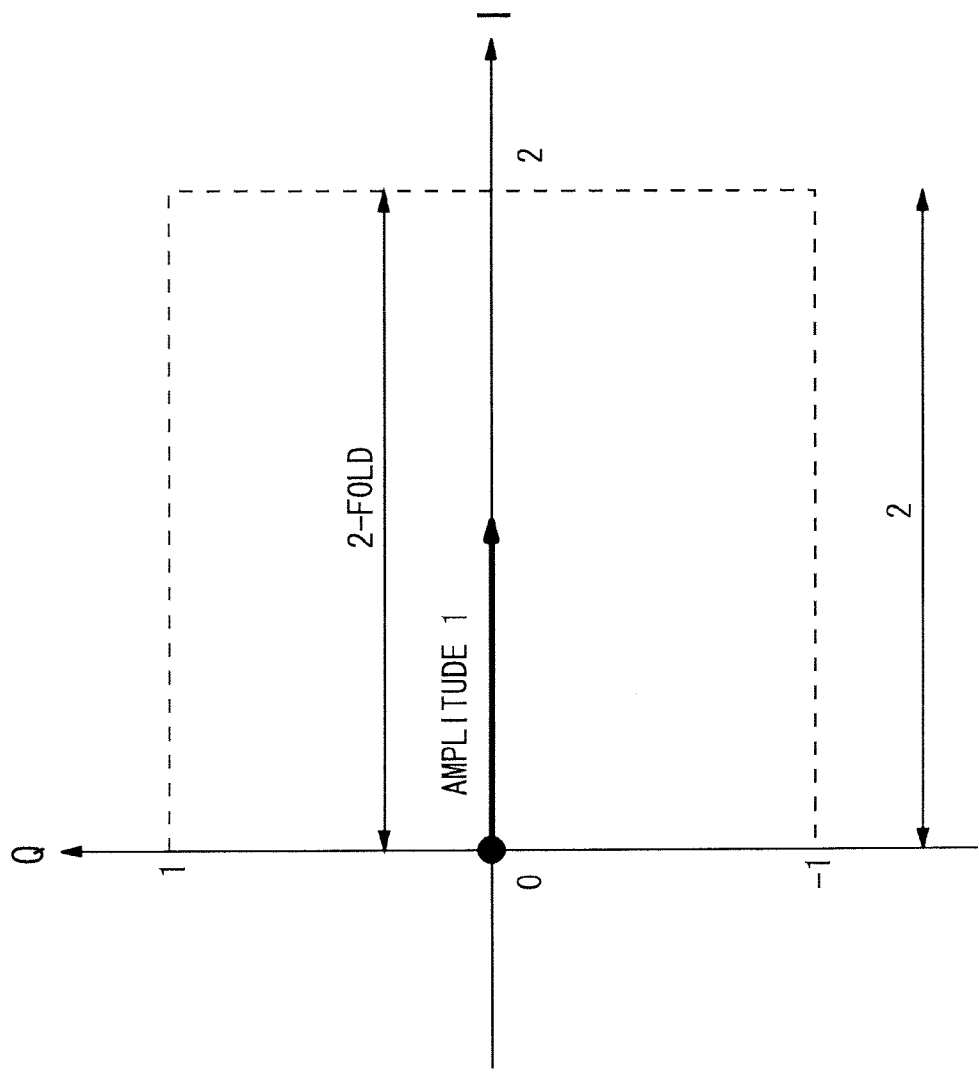
FIG. 5 is a diagram representing an example (1) of a correction range of a distortion compensation coefficient (LUT coefficient).
Figure 6:
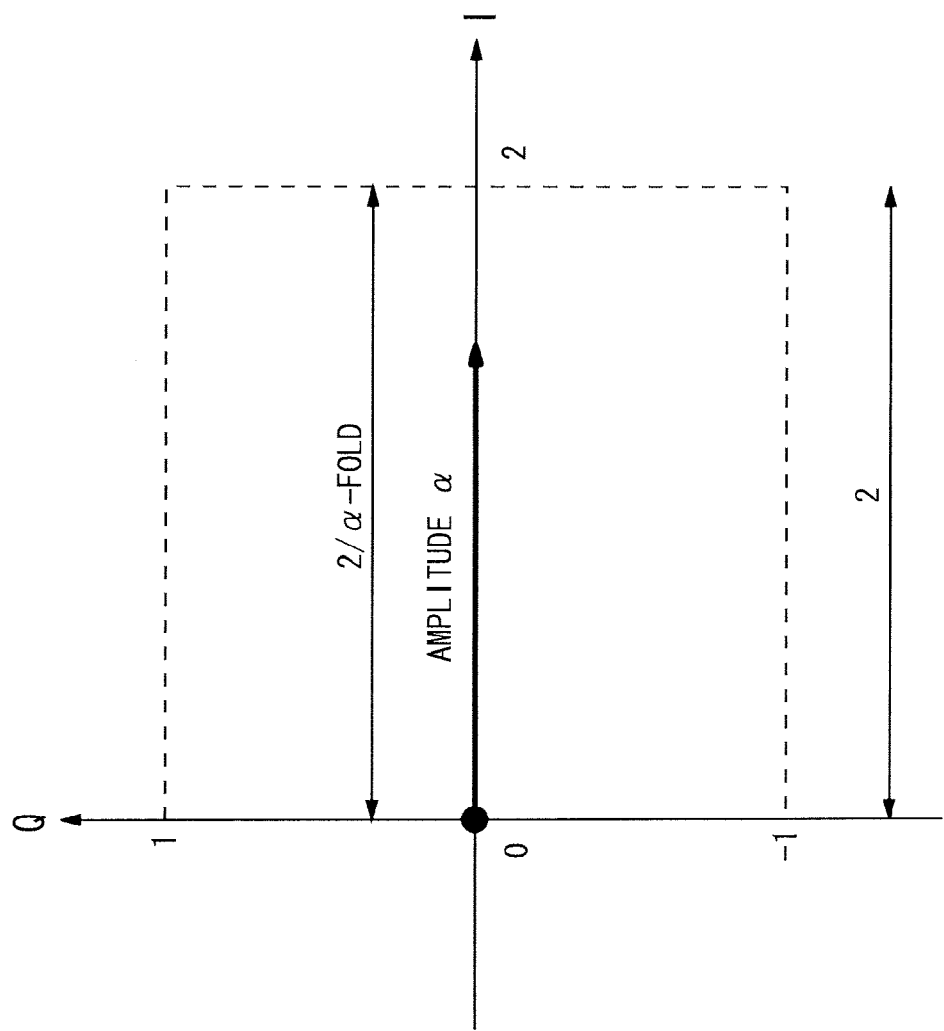
FIG. 6 is a diagram representing an example (2) of the correction range of the distortion compensation coefficient (LUT coefficient).
Figure 7:
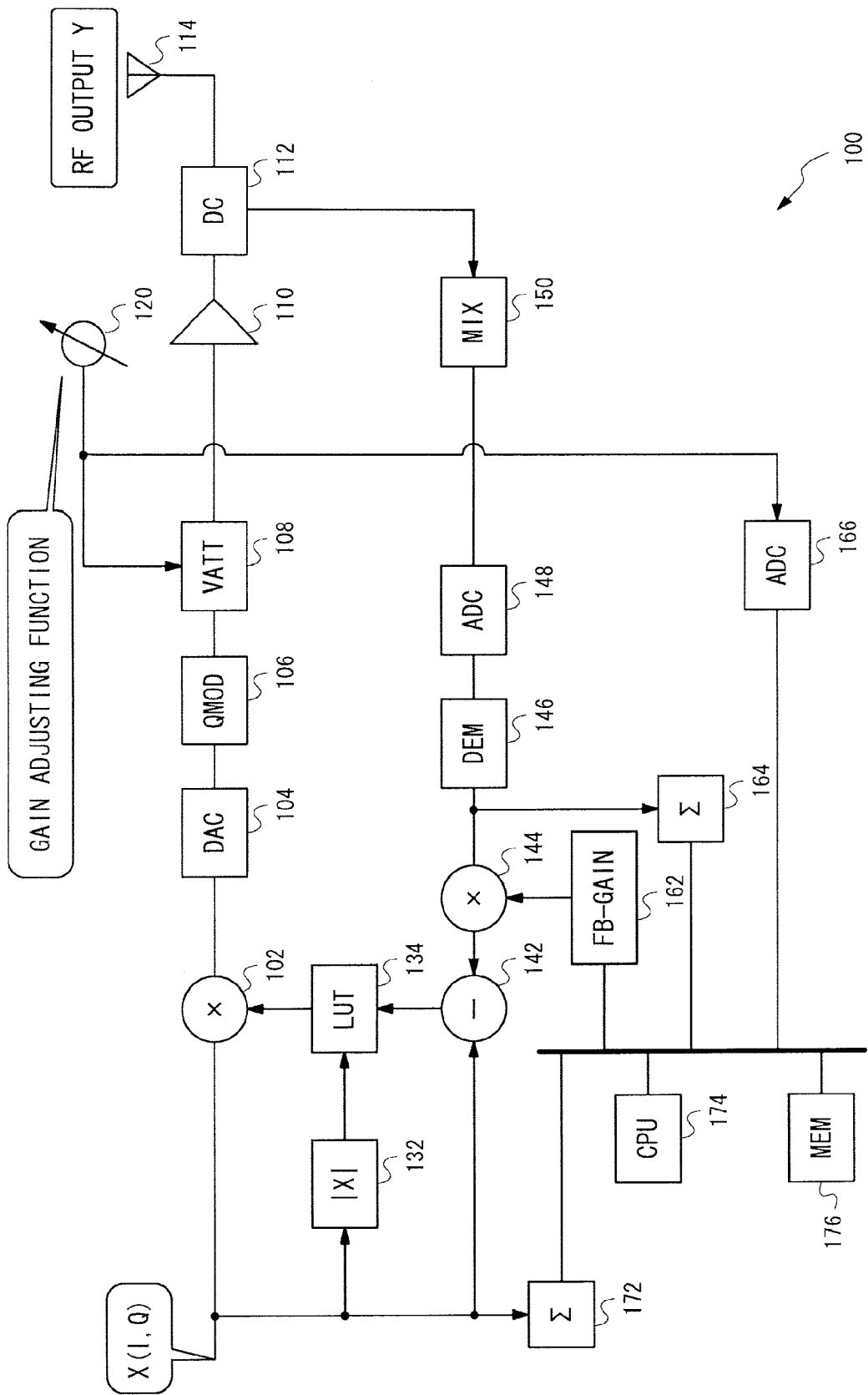
FIG. 7 is a diagram representing an example of a configuration of the distortion compensating amplifier.

FIG. 7 is a diagram representing an example of a configuration of a distortion compensating amplifier (amplifier) in a first embodiment.

A distortion compensating amplifier 100 includes a multiplier 102 which multiplies a baseband signal X(I, Q) by a LUT (Look Up Table) parameter h(|x|), a digital-to-analog converter (DAC: Digital-Analog Converter) 104, a quadrature converter (QMOD: Quadrature Modulator) 106, a VATT (Variable Attenuator, voltage variable attenuator) 108, a gain amplifier 110, a directional coupler (DC) 112, an antenna 114, a gain adjusting function unit 120, a down-converter (MIX: Mixer) 150, an analog-to-digital converter (ADC: Analog-Digital Converter) 148, a demodulator (DEM: DEModulator) 146, a multiplier 144, a subtractor 142, an amplitude calculating unit (|X|) 132, and a LUT unit 134. The distortion compensating amplifier 100 further includes an integrator 172 which integrates input signals, a feedback gain (FB-GAIN: Feedback Gain) unit 162, an integrator 164 which integrates output signals, a CPU 174 and a memory (MEM) 176. These components can be realized as hardware component and software components as well. Moreover, two or more components of those components may function as one single function unit. Any one component of those components may also function as a plurality of function units.

Circuits from the input to the antenna 114 and peripheral circuits thereto may also be called forward circuits, while circuits from the DC 112 to the subtractor 142 and peripheral circuits thereto may also be called feedback circuits.

The integrator 172 integrates input baseband signals X(I, Q) for a predetermined period of time.

The multiplier 102 multiplies the baseband signal X(I, Q) by the LUT (Look Up Table) parameter h(|x|). A multiplied result is inputted to the DAC 104.

The DAC 104 converts inputted digital signals into analog signals. The DAC 104 converts digital discrete signals into analog continuous signals.

The QMOD 106 is the quadrature modulator. The QMOD 106 transmits the baseband signal as carried on a carrier frequency.

The VATT 108 is the voltage variable attenuator. The VATT 108 can be adjusted by the gain adjusting function unit 120. A quantity of the adjustment by the gain adjusting function unit 120 is converted into the digital signals by the ADC 166 and stored in the MEM 176 etc. The gain adjusting function unit 120 can be actualized by a variable resistance etc. A magnitude of the output can be adjusted by operating the gain adjusting function unit 120. The VATT 108 can function as a first adjusting unit.

The gain amplifier 110 amplifies the input signal. In an idealistic gain amplifier, the output signal is proportional to the input signal. In an actual gain amplifier, when the input signal increases, the output does not get proportional to the input signal. Namely, when the input signal increases, the gain decreases.

The DC 112 is the directional coupler. The DC 112 has a function of detecting a signal wave from a main transmission path. The DC 112 detects the signal wave sent from the gain amplifier 110 to the antenna 114 and transmits the signal wave to the MIX 150.

The MIX 150 coverts a frequency of an RF (Radio Frequency) signal detected by the DC 112 into a frequency of an IF (Intermediate Frequency) signal.

The ADC 148 converts the inputted analog signals into the digital signals. The ADC 148 converts the analog continuous signals into the digital discrete signals.

The DEM 146 is the demodulator. The DEM 146 extracts the baseband signal from the digital signals converted by the ADC 148. The extracted baseband signal is inputted to the multiplier 144 and the integrator 164.

The integrator ($\Sigma$) 164 integrates the baseband signals inputted from the DEM 146 for a predetermined period of time.

The multiplier 144 multiplies the baseband signal inputted from the DEM 146 by a feedback gain calculated by the CPU 174. The multiplier 144 can function as a second adjusting unit.

The subtractor 142 calculates a difference between the baseband signal X(I, Q) and the signal calculated by the multiplier 144, and inputs the calculated result to the LUT unit 134.

The CPU 174 controls the distortion compensating amplifier 100 and performs arithmetic operations.

The MEM 176 is the memory. The MEM 176 can be stored with an FB gain value etc. The MEM 176 can be realized by a nonvolatile memory etc.

The amplitude calculating unit (|x|) 132 calculates an amplitude component of the baseband signal X(I, Q). The amplitude component (|x|) of the baseband signal is calculated by the following formula (8).

$$|X| = \sqrt{I^2 + Q^2} \qquad \text{Formula (8)}$$

Herein, I is an in-phase component of X, and Q is a quadrature component of X.

The LUT unit 134 updates the LUT (Look Up Table) by use of the signals inputted from the subtractor 142. In the LUT table, an LUT parameter h(|x|) is described for every amplitude component (|x|) of the baseband signal. The LUT unit 134 calculates a new LUT parameter so that the signal inputted from the subtractor 142 gets approximate to "0", and updates the LUT. Further, the LUT unit 134 refers to the LUT on the basis of the amplitude component (|x|), calculated by the amplitude calculating unit 132, of the baseband signal and outputs the LUT parameter h(|x|) to the multiplier 102.

Operational Example 1-1

Figure 8:
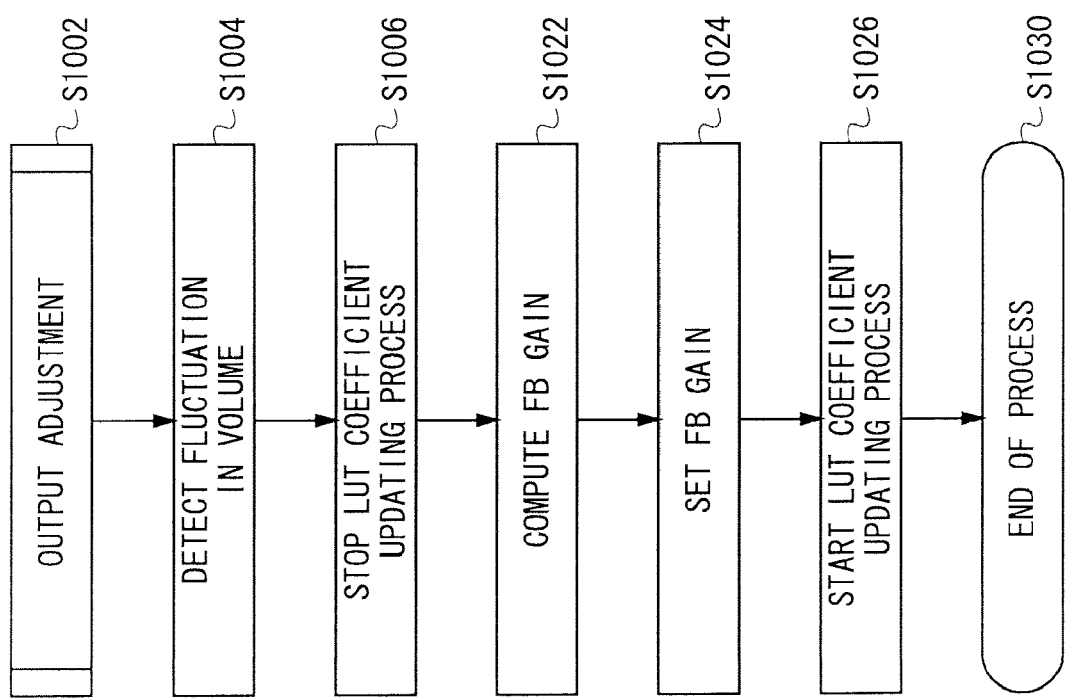
FIG. 8 is a flowchart representing an example of an operation flow of an operational example 1-1 of the distortion compensating amplifier.

FIG. 8 is a flowchart representing an example of an operation flow of an operational example 1-1 of the distortion compensating amplifier. FIG. 8 is the flowchart representing the operation flow of the distortion compensating amplifier 100 in the case of making an output adjustment by operating the gain adjusting function unit 120 when the distortion compensating amplifier 100 operates in a steady status.

The CPU 174 of the distortion compensating amplifier 100 monitors the gain adjusting function unit 120 via the ADC 166. When the gain adjusting function unit 120 is operated, an adjustment value (e.g., a braking voltage value, a resistance value) changes. The ADC 166 always converts the adjustment value of the gain adjusting function unit 120 into digital data. Further, the ADC 166 may convert, only when the adjustment value of the gain adjusting function unit 120 changes, the adjustment value into the digital data.

An assumption herein is that the gain adjusting function unit 120 is operated for the output adjustment, and the adjustment value thereof changes (S1002). The input signal to the gain amplifier 110 changes due to the VATT 108 adjusted by the gain adjusting function unit 120, and the output signal from the antenna 114 is adjusted.

The CPU 174 detects via the ADC 166 that the gain adjusting function unit 120 is operated with the result that the adjustment value thereof changes (S1004).

When detecting that the adjustment value of the gain adjusting function unit 120 has changed, the CPU 174 instructs the LUT unit 134 to stop the process of updating an LUT parameter (coefficient) (S1006). The LUT unit 134 stops the process of updating the LUT parameter in the LUT.

Supposing that the updating process is not stopped, the updating process of the LUT parameter in the LUT cancels the change in the adjustment value of the gain adjusting function unit 120. When the process of updating the LUT parameter cancels the change in the adjustment value of the gain adjusting function unit 120, there is almost no change in the output power. Hence, in this case, it follows that the function of the gain adjusting function unit 120 is ignored.

The CPU 174 computes an FB gain (Feedback Gain) (S1022). The CPU 174 acquires an integrated value of forward (FW: Forward) signals from the integrator 172 and an integrated value of feedback (FB: Feedback) signals from the integrator 164. The input baseband signal is termed the forward signal, and the signal detected by the DC 112 and transmitted toward the MIX 150 is termed the feedback signal. The CPU 174 calculates a new FB gain by the following formula (9).

$$Gfb(n+1) = \frac{\sum fw}{\left(\frac{\sum fb}{Gfb(n)}\right)} = \frac{\sum fw}{\sum fb} \cdot Gfb(n) \quad \text{Formula (9)}$$

where, $Gfb(n+1)$: the new FB gain $Gfb(n)$: the present FB gain $\sum fw$    □F the integrated value of forward signals $\sum fb$    □F the integrated value of feedback signals The CPU 174 sets a newly-calculated FB gain Gfb(n+1) as an FB gain coefficient in the FB-GAIN 162 (S1024). The FB gain is adjusted when a magnitude of the feedback signal changes due to the output adjustment, thereby disabling the output adjustment from affecting the calculation of the LUT coefficient. Note that if the forward output increases due to the output adjustment of the gain adjusting function unit 120 (if an attenuation quantity of the VATT 108 decreases), the adjustment is made so as to decrease the FB gain. Further, if the forward output decreases due to the output adjustment of the gain adjusting function unit 120 (if the attenuation quantity of the VATT 108 rises), the adjustment is made so as to increase the FB gain.

The CPU 174 instructs the LUT unit 134 to resume the process of updating the LUT parameter (LUT coefficient). The LUT unit 134 resumes the process of updating the LUT parameter (S1026). Thus, there comes to an end of the process in the case of making the output adjustment by operating the gain adjusting function unit 120 (S1030).

According to this operational example, the output adjustment is made in the forward mode and therefore reflects in the output power immediately. Further, the LUT is not updated even when making the forward output adjustment, and hence it does not happen that the output adjustment is canceled by the LUT coefficient.

The CPU 174 can save the newly-calculated FB gain Gfb(n+1) in the MEM 176. The CPU 174 reads the FB gain when started up next time, and sets the readout FB gain as the FB gain coefficient in the FB-GAIN 162, thereby enabling the level of the output power to be set as a level of output power after changing the adjustment value.

Note that the new FB gain may be calculated based on a quantity of the adjustment (a change in the voltage etc) by the gain adjusting function unit 120.

Operational Example 1-2

Figure 9:
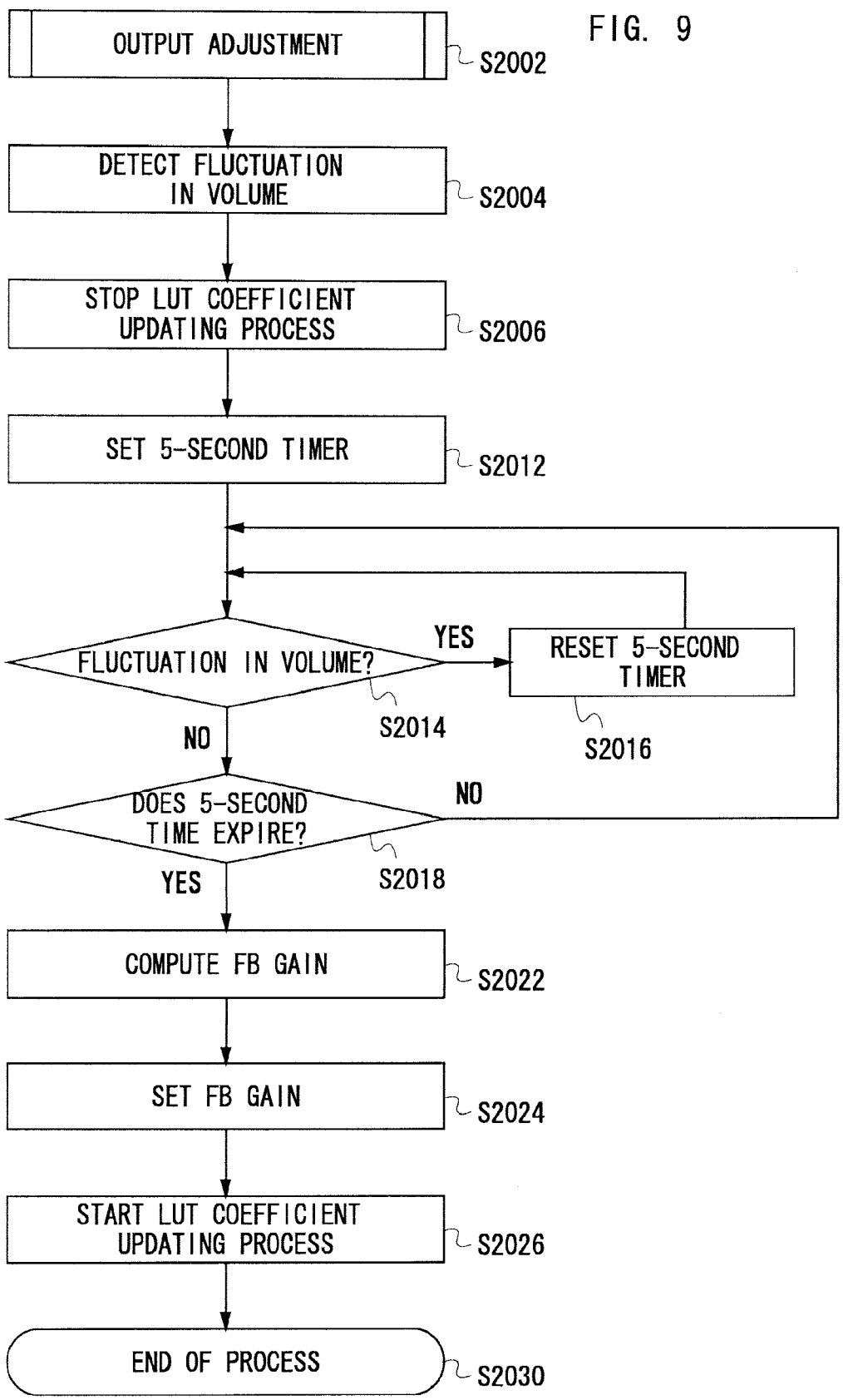
FIG. 9 is a flowchart representing an example of an operation flow of an operational example 1-2 of the distortion compensating amplifier.

FIG. 9 is a flowchart representing an instance of the operation flow of an operational example 1-2 of the distortion compensating amplifier.

The operational example 1-2 takes a scheme of standing by for calculating the FB gain till the output adjustment is stopped when detecting the output adjustment.

The CPU 174 of the distortion compensating amplifier 100 monitors the gain adjusting function unit 120 via the ADC 166. When the gain adjusting function unit 120 is operated, the adjustment value (e.g., the braking voltage value, the resistance value) changes. The ADC 166 always converts the adjustment value of the gain adjusting function unit 120 into the digital data. Further, the ADC 166 may convert, only when the adjustment value of the gain adjusting function unit 120 changes, the adjustment value into the digital data.

Herein, the assumption herein is that the gain adjusting function unit 120 is operated for the output adjustment, and the adjustment value thereof changes (S2002). The input signal to the gain amplifier 110 changes due to the VATT 108 adjusted by the gain adjusting function unit 120, and the output signal from the antenna 114 is adjusted.

The CPU 174 detects via the ADC 166 that the gain adjusting function unit 120 is operated with the result that the adjustment value thereof changes (S2004).

When detecting that the adjustment value of the gain adjusting function unit 120 has changed, the CPU 174 instructs the LUT unit 134 to stop the process of updating the LUT parameter (coefficient) (S2006). The LUT unit 134 stops the process of updating the LUT parameter in the LUT.

The CPU 174, upon detecting that the adjustment value of the gain adjusting function unit 120 has changed, starts up a 5-sec timer (S2014). This is because of standing by for a predetermined period of time till the FB gain is computed after detecting the output adjustment made by the gain adjusting function unit 120. The period of standby time can be set unrestrictedly without being limited to 5 seconds. The standby for the predetermined period of time may also be actualized by a configuration other than the timer.

The CPU 174 monitors the gain adjusting function unit 120 via the ADC 166. The CPU 174, when detecting that the gain adjusting function unit 120 is operated (S2014; YES), stops the 5-sec timer and again starts up the 5-sec timer (S2016). The CPU 174, when the 5-sec timer expires (S2018; YES) without detecting that the gain adjusting function unit 120 has been operated (S2014; NO), computes the FB gain. If the 5-sec timer does not expire (S2018; NO), the CPU 174 continues to monitor the gain adjusting function unit 120 via the ADC 166.

The CPU 174, when the 5-sec timer expires, computes the FB gain (S2022). The way of how the FB gain is computed is the same as in the case of the operational example 1-1. A period of time of the integration by the integrator 164 and the integrator 174 is well shorter than the predetermined period of time of the timer.

The CPU 174 sets the newly-calculated FB gain Gfb(n+1) as the FB gain coefficient in the FB-GAIN unit 162 (S2024). The FB gain is adjusted when the magnitude of the feedback signal changes due to the output adjustment, thereby disabling the output adjustment from affecting the calculation of the LUT coefficient.

The CPU 174 instructs the LUT unit 134 to resume the process of updating the LUT parameter (coefficient). The LUT unit 134 resumes the process of updating the LUT parameter (coefficient) (S2026). Thus, there comes to an end of the process in the case of making the output adjustment by operating the gain adjusting function unit 120 (S2030).

This operational example takes a scheme of, upon detecting the output adjustment, standing by for computing the FB gain till the output adjustment is stopped, thereby enabling the precise FB gain to be computed.

Operation and Effect of Embodiment

According to the embodiment, even when the gain adjustment function unit changes the output level of the forward signal, the LUT coefficient can be used as the idealistic value, and hence it does not happen that the distortion compensation-enabled range is narrowed. Accordingly, the distortion compensating operation with high performance can be attained.

According to the embodiment, the gain of the forward signal can be directly changed, and it is feasible to speed up the process of following up the output level when the gain adjustment function unit changes the adjustment value.

Further, according to the embodiment, the FB gain value is read from the memory, thereby enabling the post-adjustment FB gain to be set even when switching again ON the power source and to be transmitted with the transmission power after the output adjustment.

According to the embodiment, the FB gain can be adjusted fast, whereby the testing time at a factory of the distortion compensating amplifier can be reduced.

Second Embodiment

A second embodiment will hereinafter be described. The second embodiment has points common to the first embodiment. Accordingly, the discussion will be focused mainly on a different point, and the explanations of the common points will be omitted.

The scheme in the first embodiment is that the forward signal is adjusted on the analog basis, while the feedback signal is adjusted on the digital basis. The second embodiment will exemplify a scheme that the forward signal is adjusted on the digital basis, while the feedback signal is adjusted on the analog basis. An option of which basis, the analog basis or the digital basis, is taken for adjusting the forward signal or the feedback signal can be made according to the necessity.

(Configuration)

Figure 10:
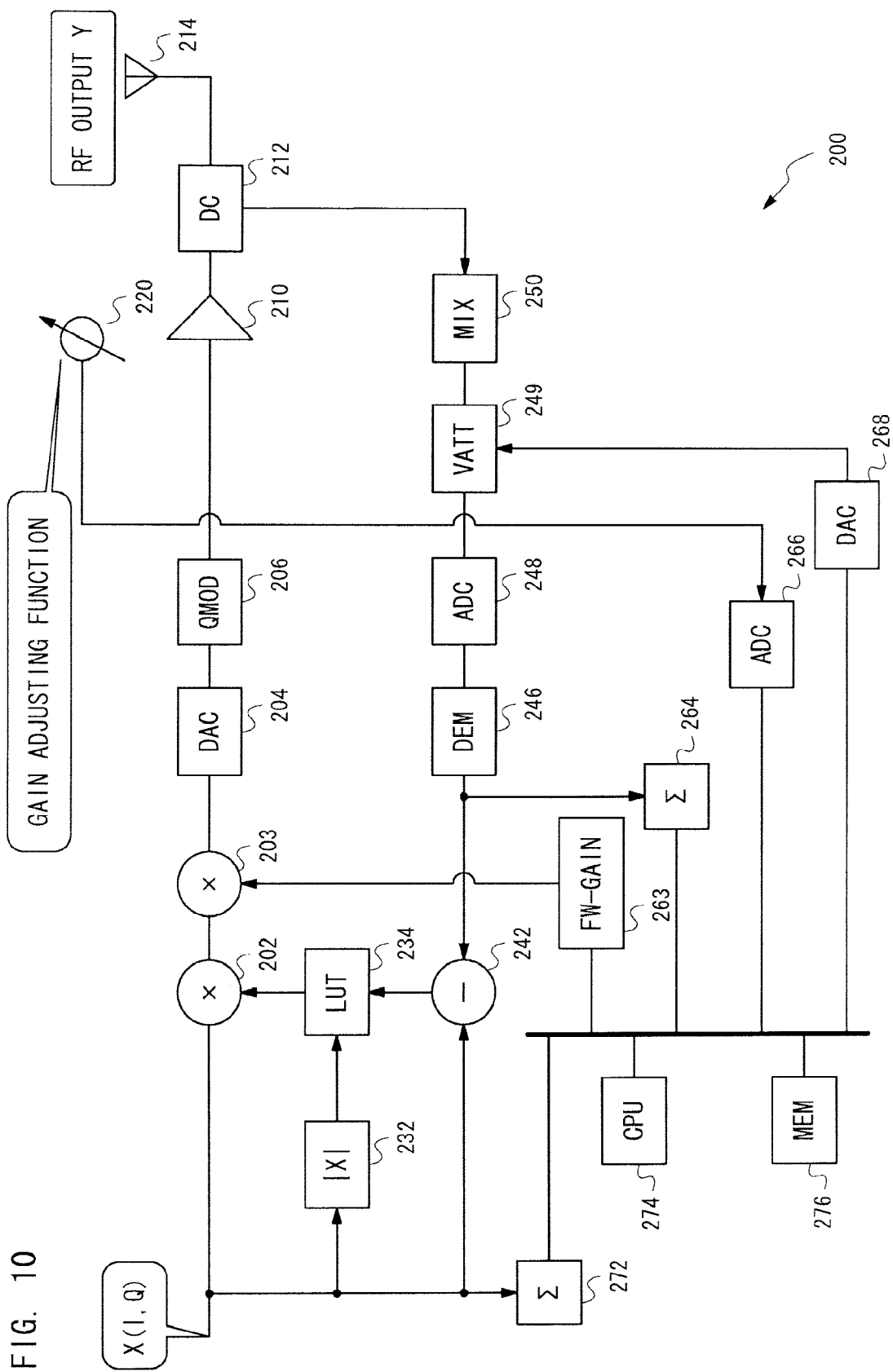
FIG. 10 is a diagram representing an example of a configuration of the distortion compensating amplifier.

FIG. 10 is a diagram representing an example of a configuration of the distortion compensating amplifier (Amplifier) in the second embodiment.

A distortion compensating amplifier 200 includes a multiplier 202 which multiplies the baseband signal X(I, Q) by the LUT (Look Up Table) parameter h(|x|), a multiplier 203 which multiplies a multiplication result of the multiplier 202 by an FW gain, a digital-to-analog converter (DAC) 204, a quadrature converter (QMOD) 206, a gain amplifier 210, a directional coupler (DC) 212, an antenna 214, a gain adjusting function unit 220, a down-converter (MIX) 250, a VATT (voltage variable attenuator) 249, an analog-to-digital converter (ADC) 248, a demodulator (DEM) 246, a subtractor 242, an amplitude calculating unit (|x|) 232, and a LUT unit 234. The distortion compensating amplifier 200 further includes an integrator 272 which integrates input signals, a forward gain (FW-GAIN; Forward Gain) unit 263, an integrator 264 which integrates output signals, a CPU 274 and a memory (MEM) 276.

The integrator 272 integrates the input baseband signals X(I, Q) for a predetermined period of time.

The multiplier 202 multiplies the baseband signal X(I, Q) by the LUT (Look Up Table) parameter h(|x|). A multiplied result is inputted to the next multiplier 203.

The multiplier 203 multiplies the multiplied result by the calculated FW gain value. The thus-multiplied result is inputted to the DAC 204.

The FW gain value is calculated by the CPU 274. The CPU 274 monitors the gain adjusting function unit 220 via the ADC 266. The output adjustment is made by operating the gain adjusting function unit 220, and the ADC 266 converts the adjustment value into the digital information from the analog information. The CPU 274 notifies the FW-GAIN unit 263 of the FW gain value. The FW-GAIN unit 263 inputs the FW gain value of which the multiplier 203 is notified.

The DAC 204 converts the inputted digital signal into the analog signal. The DAC 204 converts the digital discrete signal into the analog continuous signal.

The QMOD 206 is the quadrature modulator. The QMOD 206 transmits the baseband signal as carried on the carrier frequency.

The gain amplifier 210 amplifies the input signal. In the idealistic gain amplifier, the output signal is proportional to the input signal. In the actual gain amplifier, when the input signal increases, the output does not get proportional to the input signal. Namely, when the input signal increases, the gain decreases.

The DC 212 is the directional coupler. The DC 212 has the function of detecting the signal wave from the main transmission path. The DC 212 detects the signal wave sent from the gain amplifier 210 to the antenna 214 and transmits the signal wave to the MIX 250.

The MIX 250 coverts the frequency of the RF (Radio Frequency) signal detected by the DC 212 into the frequency of the IF (Intermediate Frequency) signal.

The VATT 249 is the voltage variable attenuator. The VATT 249 can be adjusted by the CPU 274. A quantity (FB gain value) of the adjustment of the VATT 249 is calculated by the CPU 274, then converted into the analog information by the DAC 268 and inputted to the VATT 249. A magnitude of the signal output from the MIX 250 is adjusted by the VATT 249.

The ADC 248 converts the inputted analog signal into the digital signal. The ADC 248 coverts the analog continuous signal into the digital discrete signal.

The DEM 246 is the demodulator. The DEM 246 extracts the baseband signal from the digital signals converted by the ADC 248. The extracted baseband signal is inputted to the subtractor 242 and the integrator 264.

The integrator ($\Sigma$) 264 integrates the baseband signals inputted from the DEM 246 for a predetermined period of time.

The subtractor 242 calculates a difference between the baseband signal X(I, Q) and the signal inputted from the DEM 246, and inputs the calculated result to the LUT unit 234.

The CPU 274 controls the distortion compensating amplifier 200 and performs the arithmetic operation.

The MEM 276 is a memory. The MEM 276 can save the FB gain etc. the MEM 276 can be realized by the nonvolatile memory etc.

The amplitude calculating unit (|X|) 232 computes an amplitude component of the baseband signal X(I, Q). The computing method is the same as in the case of the first embodiment. Herein, I is the in-phase component of X, and Q is the quadrature component of X.

The LUT unit 234 updates the LUT (Look Up Table) by use of the signals inputted from the subtractor 232. In the LUT table, the LUT parameter h(|X|) is described for every amplitude component (|X|) of the baseband signal. The LUT unit 234 calculates a new LUT parameter so that the signal inputted from the subtractor 234 gets approximate to "0", and updates the LUT. Further, the LUT unit 234 refers to the LUT on the basis of the amplitude component (|X|), calculated by the amplitude calculating unit 232, of the baseband signal and outputs the LUT parameter h(|X|) to the multiplier 202.

Operational Example 2-1

Figure 11:
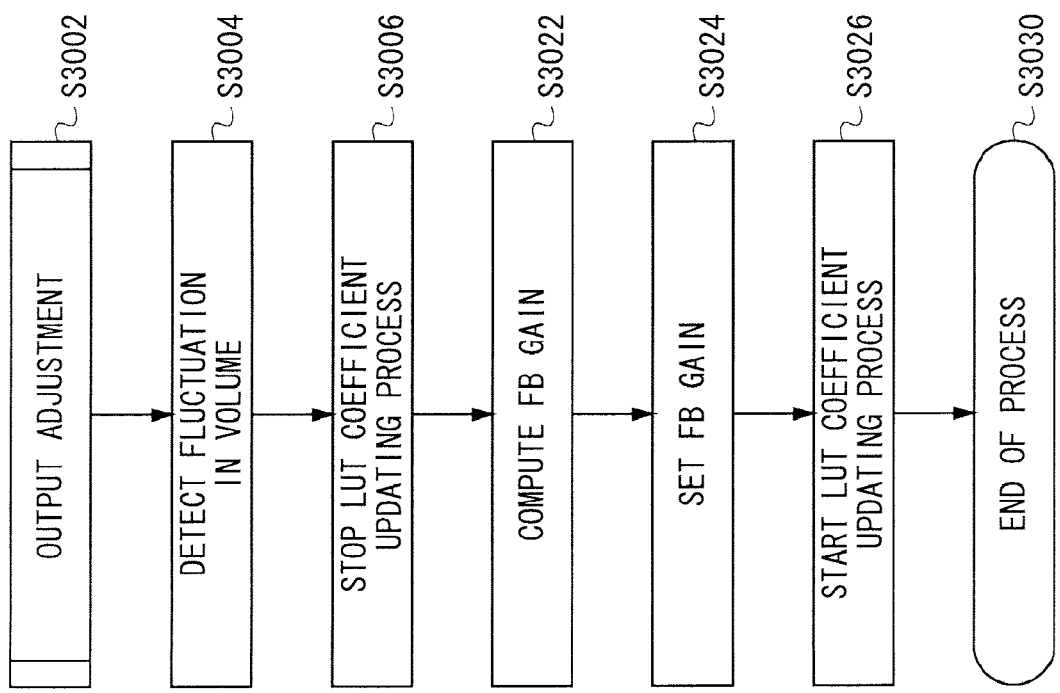
FIG. 11 is a flowchart representing an example of an operation flow of an operational example 2-1 of the distortion compensating amplifier.

FIG. 11 is a flowchart representing an example of an operation flow of an operational example 2-1 of the distortion compensating amplifier. FIG. 8 is the flowchart representing the operation flow of the distortion compensating amplifier 200 in the case of making the output adjustment by operating the gain adjusting function unit 220 when the distortion compensating amplifier 200 operates in the steady status.

The operational example 2-1 has many common points to the operational example 1-1. Herein, the discussion will be focused mainly on a different point.

The CPU 274 of the distortion compensating amplifier 200 monitors the gain adjusting function unit 220 via the ADC 266. When the gain adjusting function unit 220 is operated, the adjustment value (e.g., the braking voltage value, the resistance value) changes. The ADC 266 always converts the adjustment value of the gain adjusting function unit 220 into the digital data. Further, the ADC 266 may convert, only when the adjustment value of the gain adjusting function unit 220 changes, the adjustment value into the digital data.

Herein, the assumption herein is that the gain adjusting function unit 220 is operated for the output adjustment, and the adjustment value thereof changes (S3002). The CPU 274 detects, via the ADC 266, that the gain adjusting function unit 220 is operated with the result that the adjustment value thereof changes (S3004).

The ADC 266 converts the adjustment value of the gain adjusting function unit 220 into the digital data. The CPU 274 determines, based on the adjustment value converted into the digital data, a value by which the input baseband signal should be multiplied. The value determined by the CPU 274 can be set to the adjustment value itself or a value proportional to the adjustment value. The CPU 274 notifies the FW-GAIN unit 263 of the determined value. The multiplier 203 multiplies the value of which the FW-GAIN unit 263 is notified by the input baseband signal after being multiplied by the LUT coefficient. The output power is thereby adjusted.

Upon detecting that the adjustment value of the gain adjusting function unit 220 has changed, the CPU 274 instructs the LUT unit 234 to stop the process of updating the LUT parameter (coefficient) (S3006). The LUT unit 234 stops the process of updating the LUT parameter in the LUT.

Supposing that the updating process is not stopped, the updating process of the LUT parameter in the LUT cancels the change in the adjustment value of the gain adjusting function unit 220. When the process of updating the LUT parameter cancels the change in the adjustment value of the gain adjusting function unit 220, there is almost no change in the output power. Hence, in this case, it follows that the function of the gain adjusting function unit 220 is ignored.

The CPU 274 computes the FB gain (Feedback Gain) (S3022). The CPU 274 acquires the integrated value of the forward (FW: Forward) signals from the integrator 272 and the integrated value of the feedback (FB: Feedback) signals from the integrator 264. The method of calculating the new FB gain is the same as in the operational example 1-1 according to the first embodiment.

The CPU 274 gets the DAC 268 to convert the newly-calculated FB gain Gfb(n+1) into the analog information. The DAC 268 inputs the analog-converted value to the VATT 249. The VATT 249 is adjusted based on the inputted value (S3024). When the VATT 249 is adjusted, the signal inputted from the MIX 250 is adjusted by the thus-adjusted VATT and then inputted to the ADC 248.

The FB gain is adjusted when the magnitude of the feedback signal changes due to the output adjustment being made, thereby disabling the output adjustment from affecting the calculation of the LUT coefficient.

The CPU 274 instructs the LUT unit 234 to resume the process of updating the LUT parameter (LUT coefficient). The LUT unit 234 resumes the process of updating the LUT parameter in the LUT (S3026). Thus, there comes to an end of the process in the case of making the output adjustment by operating the gain adjusting function unit 220 (S3030).

According to this operational example, the adjustment value of the gain adjusting function unit is converted into the digital information, and the digital information is multiplied by the input baseband signal. Hence, the output adjustment by the gain adjusting function unit reflects in the output power immediately. Further, the LUT is not updated even when making the forward output adjustment, and therefore it does not happen that the output adjustment is canceled by the LUT coefficient.

The CPU 274 can save the newly-calculated FB gain Gfb(n+1) in the MEM 276. The CPU 274 reads the FB gain when started up next time, and sets the readout FB gain as the FB gain coefficient in the VATT 249 via the DAC 268, thereby enabling the level of the output power to be set as a level of output power after changing the adjustment value.

Operational Example 2-2

Figure 12:
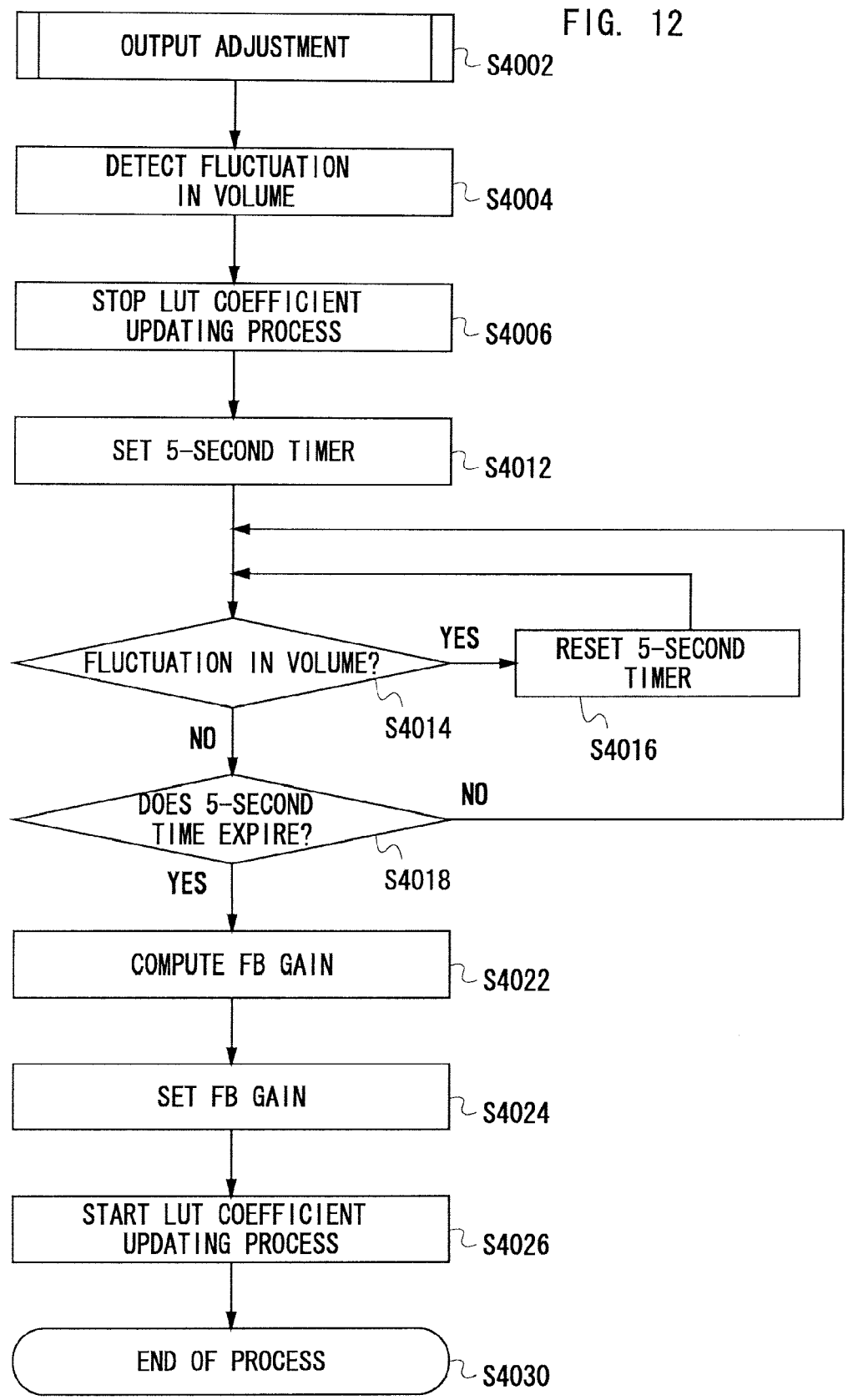
FIG. 12 is a flowchart representing an example of an operation flow of an operational example 2-2 of the distortion compensating amplifier.

FIG. 12 is a flowchart representing an example of an operation flow of an operational example 2-2 of the distortion compensating amplifier.

The operational example 2-2 takes a scheme of standing by for computing the FB gain till the output adjustment is stopped upon detecting the output adjustment.

The operational example 2-2 has many points common to the operational example 1-2. Herein, the discussion will be focused mainly on a different point.

The CPU 274 of the distortion compensating amplifier 200 monitors the gain adjusting function unit 220 via the ADC 266. When the gain adjusting function unit 220 is operated, the adjustment value (e.g., the braking voltage value, the resistance value) changes. The ADC 266 always converts the adjustment value of the gain adjusting function unit 220 into the digital data. Further, the ADC 266 may convert, only when the adjustment value of the gain adjusting function unit 220 changes, the adjustment value into the digital data.

Herein, the assumption herein is that the gain adjusting function unit 220 is operated for the output adjustment, and the adjustment value thereof changes (S4002). The CPU 274 detects, via the ADC 266, that the gain adjusting function unit 220 is operated with the result that the adjustment value thereof changes (S4004).

The ADC 266 converts the adjustment value of the gain adjusting function unit 220 into the digital data. The CPU 274 determines, based on the adjustment value converted into the digital data, a value by which the input baseband signal should be multiplied. The value determined by the CPU 274 can be set to the adjustment value itself or a value proportional to the adjustment value. The CPU 274 notifies the FW-GAIN unit 263 of the determined value. The multiplier 203 multiplies the value of which the FW-GAIN unit 263 is notified by the input baseband signal after being multiplied by the LUT coefficient. The output power is thereby adjusted.

Upon detecting that the adjustment value of the gain adjusting function unit 220 has changed, the CPU 274 instructs the LUT unit 234 to stop the process of updating the LUT parameter (coefficient) (S4006). The LUT unit 234 stops the process of updating the LUT parameter in the LUT.

The CPU 274, upon detecting that the adjustment value of the gain adjusting function unit 220 has changed, starts up the 5-sec timer (S3014). This is because of standing by for a predetermined period of time till the FB gain is computed after detecting the output adjustment made by the gain adjusting function unit 220. The period of standby time can be set unrestrictedly without being limited to 5 seconds.

The CPU 274 monitors the gain adjusting function unit 220 via the ADC 266. The CPU 274, when detecting that the gain adjusting function unit 220 is operated (S4014; YES), stops the 5-sec timer and again starts up the 5-sec timer (S4016). The CPU 274, when the 5-sec timer expires (S4018; YES) without detecting that the gain adjusting function unit 220 has been operated (S4014; NO), computes the FB gain. If the 5-sec timer does not expire (S4018; NO), the CPU 274 continues to monitor the gain adjusting function unit 220 via the ADC 266.

The CPU 274, when the 5-sec timer expires, computes the FB gain (S4022). The way of how the FB gain is computed is the same as in the case of the operational example 2-1. A period of time of the integration by the integrator 264 and the integrator 274 is well shorter than the predetermined period of time of the timer.

The CPU 274 gets the DAC 268 to convert the newly-calculated FB gain Gfb(n+1) into the analog information. The DAC 268 inputs the analog-converted value to the VATT 249. The VATT 249 is adjusted based on the inputted value (S4024). When the VATT 249 is adjusted, the signal inputted from the MIX 250 is adjusted by the thus-adjusted VATT and then inputted to the ADC 248.

The FB gain is adjusted when the magnitude of the feedback signal changes due to the output adjustment being made, thereby disabling the output adjustment from affecting the calculation of the LUT coefficient.

The CPU 274 instructs the LUT unit 234 to resume the process of updating the LUT parameter (LUT coefficient). The LUT unit 234 resumes the process of updating the LUT parameter in the LUT (S4026). Thus, there comes to an end of the process in the case of making the output adjustment by operating the gain adjusting function unit 220 (S4030).

The operational example 2-2 takes the scheme of standing by for computing the FB gain till the output adjustment is stopped upon detecting the output adjustment, whereby the precise FB gain can be computed.

Operation and Effect of Embodiment

According to the second embodiment, the baseband signal is multiplied by the forward gain calculated in a way that converts the adjustment value by the gain adjusting function unit into the digital information, thereby enabling the output signal to follow up the adjustment by the gain adjusting function unit. The feedback gain is calculated based on the input signal and the adjusted output signal, thereby disabling the adjustment by the adjustment by the gain adjusting function unit from affecting the update of the LUT coefficient. Hence, the LUT coefficient can be used as the idealistic value, and it does not happen that the distortion compensation-enabled range gets narrowed. Accordingly, the distortion compensating operation with the high performance can be attained.

Further, according to the second embodiment, the FB gain value is read from the memory, thereby enabling the post-adjustment FB gain to be set even when switching again ON the power source and to be transmitted with the transmission power after the output adjustment.

According to the second embodiment, the FB gain can be adjusted fast, whereby the testing time at the factory of the distortion compensating amplifier can be reduced.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A distortion compensating amplifier comprising a forward circuit and a feedback circuit and performing distortion compensation of a signal in said forward circuit by use of a gain of said feedback circuit, comprising:
   a gain adjusting unit configured to adjust the gain of said forward circuit;
   a detecting unit configured to detect that the gain of said forward circuit is changed by the gain adjusting unit;
   a calculating unit configured to calculate, when said detecting unit detects that the gain of said forward circuit is changed, the gain of said feedback circuit on the basis of an input signal to said forward circuit and an output signal from said forward circuit; and
   a feedback gain updating unit configured to update a present gain of said feedback circuit with the gain calculated by said calculating unit.

2. The distortion compensating amplifier according to claim 1, further comprising:
   a distortion compensation coefficient updating unit configured to update a distortion compensation coefficient for compensating a distortion of the output signal; and
   an instructing unit configured to instruct, when said detecting unit detects that the gain of said forward circuit is changed, said distortion compensation coefficient updating unit to stop updating the distortion compensation coefficient, and to instruct said distortion compensation coefficient updating unit to resume updating the distortion compensation coefficient after said feedback gain updating unit has updated the gain of said feedback circuit.

3. The distortion compensating amplifier according to claim 1, wherein said calculating unit, when said detecting unit detects that the gain of said forward circuit is changed, stands by till a predetermined period of time elapses and calculates the gain of said feedback circuit, and
   said calculating unit, when said detecting unit again detects that the gain of said forward circuit is changed until the predetermined period of time elapses, thereafter stands by until the predetermined period of time elapses and calculates the gain of said feedback circuit.

4. The distortion compensating amplifier according to claim 1, further comprising a storage unit stored with the gain of said feedback circuit,
   wherein said feedback gain updating unit, when started up, changes the gain of said feedback circuit into the present gain of said feedback circuit, which is stored in said storage unit.

5. The distortion compensating amplifier according to claim 1, wherein said calculating unit calculates, as a new gain of said feedback circuit, a value obtained that multiplies, by the present gain of said feedback circuit, a value into which a value acquired by integrating the input signals for a predetermined period of time is divided by a value acquired by integrating the output signals for the predetermined period of time.

6. A front-end distortion compensation amplifying device including a distortion compensation processing unit configured to execute a pre distortion compensating process of an inputted signal by use of a distortion compensation coefficient; an amplifier configured to amplify the signal undergoing the pre distortion compensating process; and an update processing unit configured to execute an updating process of the distortion compensation coefficient on the basis of a comparison between the signal before undergoing the distortion compensating process and a feedback signal of the signal after being amplified by said amplifier, the front-end distortion compensation amplifying device comprising:
- a first adjusting unit configured to adjust a level of the signal undergoing the pre distortion compensating process and amplified by said amplifier;
- a second adjusting unit configured to adjust a level of the feedback signal; and
- a control unit configured to change a quantity of the adjustment by said second adjusting unit corresponding to the adjustment by said first adjusting unit.

* * * * *